United States Patent
Jain et al.

(10) Patent No.: US 8,248,130 B2
(45) Date of Patent: Aug. 21, 2012

(54) DUTY CYCLE CORRECTION CIRCUIT

(75) Inventors: Vinod Jain, Noida (IN); Deependra K. Jain, Jabalpur (IN); Krishna Thakur, Greater Noida (IN); Avinish Chandra Tripathi, Noida (IN); Sanjay Kumar Wadhwa, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 254 days.

(21) Appl. No.: 12/786,496

(22) Filed: May 25, 2010

(65) Prior Publication Data

US 2011/0291724 A1    Dec. 1, 2011

(51) Int. Cl.
*H03K 3/17*    (2006.01)
*H03K 5/04*    (2006.01)
*H03K 7/08*    (2006.01)

(52) U.S. Cl. ...................................................... 327/175
(58) Field of Classification Search .................. 327/158, 327/161, 175
See application file for complete search history.

(56) References Cited

U.S. PATENT DOCUMENTS

| 7,423,467 | B1 | 9/2008 | Simon | |
|---|---|---|---|---|
| 2006/0214713 | A1* | 9/2006 | Matsuoka | 327/175 |
| 2009/0160516 | A1* | 6/2009 | Guo et al. | 327/175 |

OTHER PUBLICATIONS

Huang, Hong Yi et al., Low Power 50% Duty Cycle, IEEE 2008.
Huang, Hong Yi et al., Pulsewidth Control Loop Circuit Using Combined Charge Pumps and Miller Scheme, IEEE 2004.
Mu, Fenghao and Christer Svensson, Pulsewidth Control Loop in High Speed CMOS Clock Buffers, IEEE Transactions on Solid State Circuits, vol. 25, No. 2, Feb. 2000, pp. 134-141.

* cited by examiner

*Primary Examiner* — Lincoln Donovan
*Assistant Examiner* — Daniel Rojas
(74) *Attorney, Agent, or Firm* — Charles Bergere

(57) ABSTRACT

A duty cycle correction circuit for correcting the duty cycle of a clock signal generated by a clock generator includes a complementary buffer chain, level shifter circuits and a self-bias circuit. A clock signal with a distorted duty cycle and its complement are provided to the level shifter circuits. The level shifter circuits reduce the magnitude of voltage of the clock signal and the complement and generate level shifted signals. The level shifted signals are provided to a differential amplifier that generates a control signal indicating the magnitude of distortion in the duty cycle. The control signal is used to correct the duty cycle of the clock signal. The self-bias circuit is used to bias the differential amplifier.

11 Claims, 4 Drawing Sheets

DUTY CYCLE CORRECTION CIRCUIT

BACKGROUND OF THE INVENTION

The present invention relates generally to integrated circuits (ICs) and more particularly, to duty cycle correction of a clock signal.

Integrated circuits (ICs) include multiple clock domains. A clock domain is characterized by being driven by a clock signal. The clock signal may be generated within the IC or provided from a clock source external to the IC. Each clock domain contains logic elements such as flip-flops and latches, which operate upon the receipt of active edges of the clock signal.

The clock signal is generated using circuits such as Phase Locked Loops (PLLs) and oscillators. The clock signal is subsequently routed to the various clock domains. Often the clock sources are located far from the site where the clock signals are required. Thus, the clock signal may have to pass through several buffer stages before reaching the core logic circuit. As a result, the clock signal may become distorted, leading to a change in the duty cycle of the clock signal, which may lead to degradation in the performance of the IC.

Various circuits have been designed to correct the duty cycle of the clock signal received by the core logic circuits. FIG. 1 illustrates an example of a conventional duty cycle correction circuit 100. The duty cycle correction circuit 100 includes a PLL clock generator 102, a buffer chain 104, a resistor ladder 106, a comparator 108, a duty cycle-to-voltage converter 110, a voltage-to-duty cycle converter 112, and an output buffer 114. The voltage-to-duty cycle converter 112 includes a current starved inverter 116, and current sources 118a and 118b.

The PLL clock generator 102 generates a clock signal of a predefined frequency and duty cycle. The clock signal passes through the buffer chain 104, which is representative of a clock path that the clock signal traverses before reaching the clock domains or the core logic circuit. Due to passage through the buffer chain 104, the emerging clock signal has a distorted duty cycle. The clock signal with distorted duty cycle is provided to the voltage-to-duty cycle converter 112. The current starved inverter 116 adjusts the duty cycle of the clock signal as a function of the magnitude of current generated by the current sources 118a and 118b. The current generated by the current sources 118a and 118b adjusts, i.e., increases or decreases, the rise and fall times of the clock signal. The current source 118a is a p-type metal oxide semiconductor (PMOS) transistor and the current source 118b is an n-type metal oxide semiconductor (NMOS) transistor.

The magnitude of the current generated by the current sources 118a and 118b is a function of a control signal output by the comparator 108, which represents the difference (error) existing between input signals provided at positive and negative terminals of the comparator 108. The input signal at the negative terminal of the comparator 108 is obtained from the duty cycle-to-voltage converter 110. The duty cycle-to-voltage converter 110 is an RC circuit that receives the distorted duty cycle clock signal from the output buffer 114. The duty cycle-to-voltage converter 110 generates an output signal having a voltage magnitude that represents the duty cycle of the clock signal. The output signal may be referred to as a distorted duty cycle signal. This distorted duty cycle signal is provided to the negative terminal of the comparator 108.

The input signal provided at the positive terminal of the comparator 108 is a reference voltage ($V_{ref}$). If the ideal duty cycle of the clock signal is 50% and the voltage magnitude of the clock signal when it is high is $V_{dd}$, the voltage signal representing this clock signal with ideal duty cycle would be $V_{dd}/2$. Therefore, $V_{ref}$ is obtained by coupling the positive terminal of the comparator 108 to a midpoint of the resistor ladder 106. Thus, $V_{ref}=V_{dd}/2$.

The comparator 108 compares the output of the duty cycle-to-voltage converter 110 (magnitude of which is either $<V_{dd}/2$ or $>V_{dd}/2$) with the reference voltage signal (magnitude=$V_{dd}/2$) to obtain an error signal. The greater the difference between the two input signals, the greater the magnitude of the error signal.

As explained earlier, the error signal is used to control the magnitude of the current generated by the current sources 118a and 118b. The current generated by the current sources 118a and 118b in turn controls the magnitude of adjustment provided to the distorted duty cycle clock signal by the current starved inverter 116. The adjustment provided to the distorted duty cycle clock signal shifts the duty cycle closer to the ideal duty cycle. The adjustment is provided to an incoming clock signal, i.e., output of the buffer chain 104, until the duty cycle of the output clock signal, i.e., output of the output buffer 114, is equal to the ideal duty cycle. In a steady state, the reference signal provided to the positive terminal of the comparator 108 becomes equal to the output of the duty cycle-to-voltage converter 110 provided to the negative terminal of the comparator 108. The duty cycle correction circuit 100 thus provides a corrected duty cycle clock signal.

However, the duty cycle correction circuit 100 requires a reference signal for comparison with the distorted duty cycle clock signal. The reference signal is generated using the resistor ladder 106. Further, the comparator 108, which is an operational amplifier, requires a supply voltage higher than the supply voltage of the logic circuit to which the corrected clock signal is provided. Additionally, the comparator 108 requires a current reference circuit in order to function correctly. It would be advantageous to have a duty cycle correction circuit that consumed less power. It also would be advantageous to have a duty cycle correction circuit that operated at the same voltage as the circuits to which the clock signal is provided.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
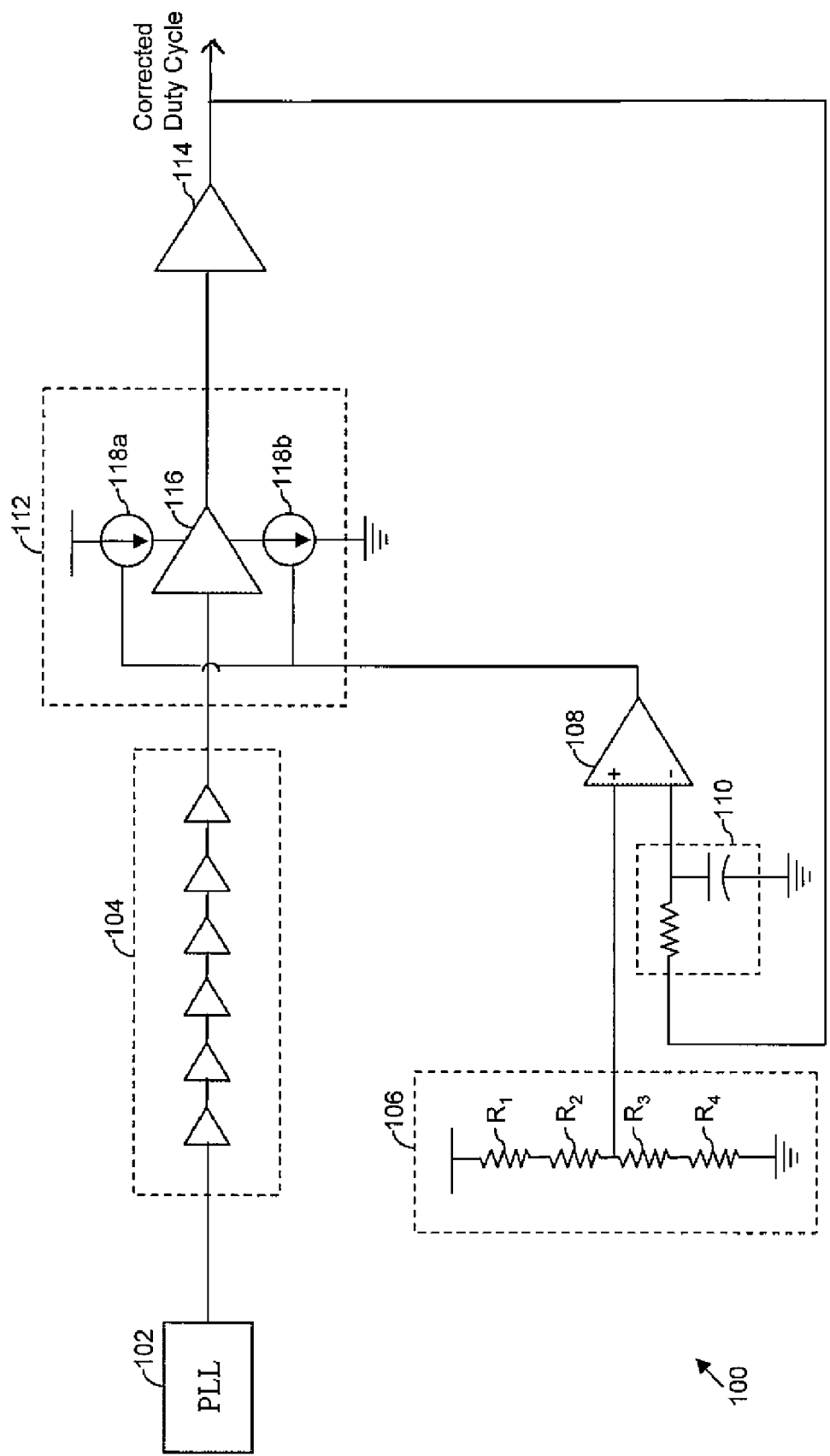
FIG. 1 is a schematic diagram illustrating a conventional duty cycle corrector circuit.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present, a duty cycle correction circuit for correcting the duty cycle of an input clock signal is provided. The duty cycle correction circuit includes a pulse-width control block, first and second buffer chains connected to the pulse-width control block, a first duty cycle-to-voltage converter connected to the first buffer chain, and a second duty cycle-to-voltage converter connected to the second buffer chain. The duty cycle correction circuit includes first and second operational amplifiers connected to the first and the second duty cycle-to-voltage converters respectively. A resistor ladder is connected to the second operational amplifier and generates second and third output signals, where the third output signal has a magnitude that is a fraction of magnitude of the second output signal. The duty cycle correction circuit further includes a differential amplifier, connected to the pulse-width control block, the first operational amplifier, and to the resistor ladder, for generating the control signal. The differential amplifier generates the control signal based on the first and third output signals. A self-bias generator is connected to the first operational amplifier, the resistor ladder, and the differential amplifier for generating a self-bias signal based on the first and third output signals. The self-bias signal is used to bias the differential amplifier.

In another embodiment of the present, a duty cycle correction circuit for correcting duty cycle of an input clock signal is provided. The duty cycle correction circuit includes a pulse-width control block, first and second buffer chains connected to the pulse-width control block, a first duty cycle-to-voltage converter connected to the first buffer chain, and a second duty cycle-to-voltage converter connected to the second buffer chain. First and second level shifters are connected to the first and second duty cycle-to-voltage converters respectively, and a differential amplifier is connected to the first and second level shifters. A self-bias generator is connected to the first and the second level shifters.

The pulse-width control block receives an input clock signal and a control signal and generates an adjusted clock signal based on the control signal by adjusting pulse-width of the input clock signal. The adjusted clock signal is provided to the first and second buffer chains for generating first and second clock signals respectively. The first buffer chain has an even number of inverters and a pass transistor, and the second buffer chain has an odd number of inverters. The first and the second clock signals are provided to the first and the second duty cycle-to-voltage converters, which generate first and second duty cycle signals representing duty cycles of the first and the second clock signals.

The first and the second duty cycle signals are provided to the first and the second level shifters, which shift the first and the second duty cycle signals by a predetermined value to generate first and second level shifted signals. The first and the second level shifted signals are provided to the differential amplifier. The differential amplifier generates the control signal based on the first and the second level shifted signals. Further, the first and the second level shifted signals are provided to the self-bias generator. The self-bias generator generates a self-bias signal for biasing the differential amplifier. The self-bias signal is generated based on the first and the second level shifted signals.

In an alternative embodiment of the present invention, the first and the second duty cycle signals are provided to the first and second amplifiers to obtain the first and the second output signals. The first output signal is provided to the differential amplifier. The second output signal is provided to a resistor ladder to obtain a third output signal, which is provided to the differential amplifier. Further, the first and the third output signals are provided to the self-bias generator. The self-bias generator generates a self-bias signal for biasing the differential amplifier. The self-bias signal is generated based on the first and the third output signals.

Figure 2:
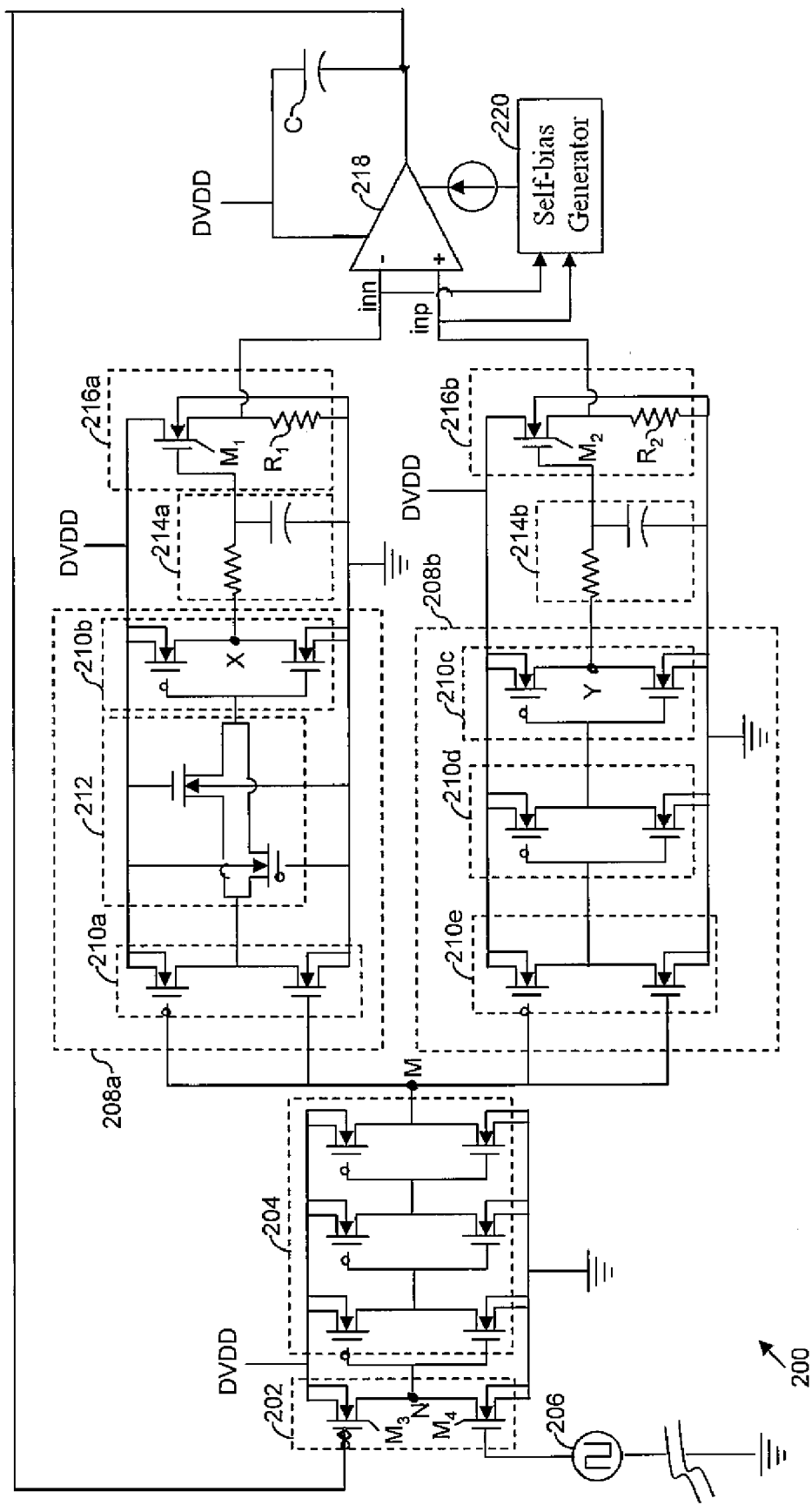
FIG. 2 is a schematic diagram illustrating a duty cycle correction circuit in accordance with an embodiment of the present invention.

Referring now to FIG. 2, a schematic diagram illustrating a duty cycle corrector (DCC) circuit 200 in accordance with an embodiment of the present invention is shown. The DCC circuit 200 includes a pseudo-inverter 202, a buffer chain 204, a Phase Locked Loop (PLL) 206, complementary buffer chains 208a and 208b, inverters 210a, 210b, 210c, 210d, and 210e, a pass transistor 212, first and second duty cycle-to-voltage converters 214a and 214b, first and second level shifters 216a and 216b, a differential amplifier 218, and a self-bias generator 220.

Figure 4:
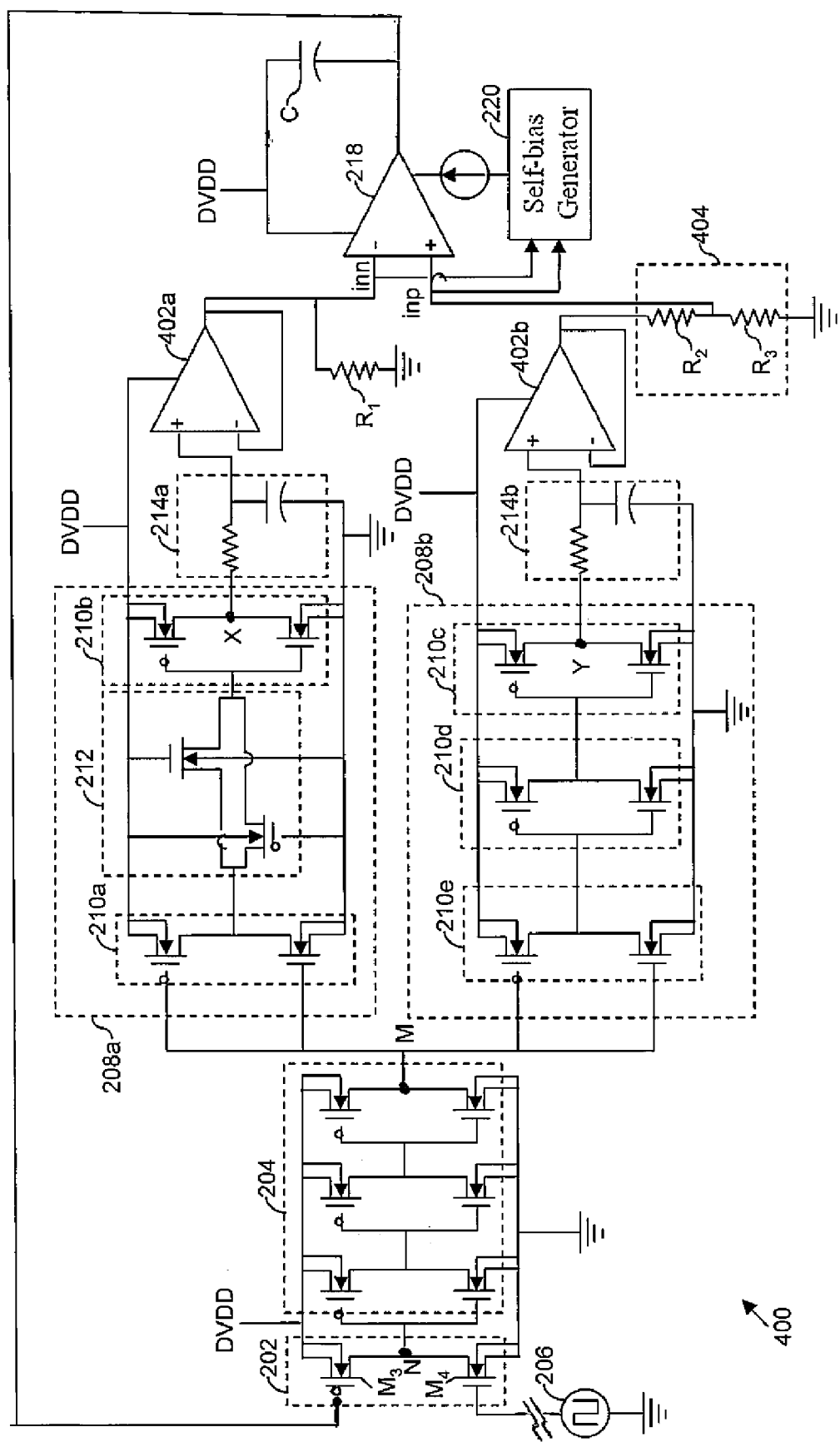
FIG. 4 is a schematic diagram illustrating a duty cycle correction circuit in accordance with another embodiment of the present invention.

The PLL 206 generates a clock signal that is provided to one or more digital logic circuits (not shown). If the PLL 206 is located away from these digital logic circuits, the clock signal is routed through several buffer stages (not shown). Therefore, the duty cycle of the buffered clock signal will deviate from the value at which the clock signal was generated and thus should be corrected. An NMOS transistor of the pseudo-inverter 202 receives the clock signal with the deviated duty cycle. Further, a PMOS transistor of the pseudo-inverter 202 is provided with an error signal or a control signal obtained at an output of the differential amplifier 218. The pseudo-inverter 202 has the same structure and components as a normal inverter, but different operational characteristics. More specifically, the pseudo-inverter 202 functions as a voltage controlled pulse-width generator. The control signal provided to the PMOS transistor of the pseudo-inverter 202 is used to adjust pulse-width of the clock signal input to the NMOS transistor to ensure that the duty cycle of an adjusted clock signal is equal to the ideal duty cycle. The DCC 200 adjusts the duty cycle of the input clock signal such that the duty cycle of the adjusted clock signal becomes equal to 50%. In an embodiment of the present invention, to obtain the adjusted clock signal having duty cycle equal to a predetermined value, for example 60%, 70% and so forth, the DCC 200 may be modified as illustrated in FIG. 4 (described later).

An output clock signal obtained at a node N located between the PMOS and NMOS transistors of the pass transistor 202 has inverted switching characteristics compared to the switching characteristics of the clock signal input to the NMOS transistor of the pseudo-inverter 202. Therefore, to obtain the output clock signal with switching characteristics similar to the switching characteristics of the input clock signal, the output clock signal is provided to the buffer chain 204, which has an odd number of inverters. For example, the buffer chain 204 illustrated in FIG. 2 has three inverters. The output clock signal is obtained at a node M, which is the output of the buffer chain 204. The output clock signal is provided to first and second complementary buffer chains 208a and 208b. The complementary buffer chain 208a includes two inverters 210a and 210b, and the complementary buffer chain 208b includes three inverters 210c, 210d, and 210e. Additionally, the complementary buffer chain 208a includes the pass transistor 212 for matching delays observed in the output clock signals travelling through the complementary buffer chains 208a and 208b and emerging at nodes X and Y respectively.

The output clock signals obtained at the nodes X and Y are opposite in polarity with respect to each other. The output signal at the node X is termed hereafter the first clock signal and the output signal at the node Y is termed hereafter the second clock signal. The first and second clock signals are provided to the first and second duty cycle-to-voltage converters 214a and 214b. The first and second duty cycle-to-voltage converters 214a and 214b generate respective first and second duty cycle signals having voltage magnitudes representing the deviated duty cycles of the first and the second clock signals. The first and the second duty cycle signals are provided to the first and second level shifters 216a and 216b. The first level shifter 216a includes a NMOS transistor $M_1$ and a resistor $R_1$ connected to a source of the transistor $M_1$. Similarly, the second level shifter 216b includes a NMOS transistors $M_2$ and a resistor $R_2$ connected to a source of the NMOS transistors $M_2$.

The first and the second duty cycle signals are applied to the gates of the NMOS transistors $M_1$ and $M_2$. The NMOS transistors $M_1$ and $M_2$ provide first and second level shifted signals at their sources. It should be understood by persons skilled in the art that if the input signal having voltage $V_g$ is provided at a gate of an NMOS transistor, an output signal obtained at a source of the NMOS transistor will have a voltage equal to $V_g-V_t$, in which $V_t$ is the threshold voltage of the NMOS transistor. Therefore, the input signal voltage magnitude is reduced or level shifted by $V_t$. In the embodiment shown in FIG. 2, the first and the second level shifted signals obtained at the sources of the NMOS transistors $M_1$ and $M_2$ have voltage magnitudes reduced by $V_t$, as compared to the first and second duty cycle signals. This level shifts the voltage magnitudes of the first and the second duty cycle signals to a lower range to generate the first and the second level shifted signals.

The first and the second level shifted signals are provided as negative terminal input signal (inn) and positive terminal input signal (inp) to the differential amplifier 218. The lower voltage range (compared to the first and second duty cycle signals) of inn and inp makes them suitable for being input to the differential amplifier 218. It will be understood by persons skilled in the art that in a scenario when transistors used in an internal input stage (not shown) of the differential amplifier 218 are NMOS transistors, the level shifters 216a and 216b include PMOS transistors instead of NMOS transistors. Level shifters that include PMOS transistors would increase voltage levels of the first and the second duty cycle signals. The differential amplifier 218 amplifies the difference between the input signals. Therefore, when inn and inp differ in magnitude, i.e. the duty cycles of the first and the second clock signals are not equal, which will occur when the duty cycle of the input clock signal is not equal to 50%, an output signal (the control signal) is generated by the differential amplifier 218, which is the amplified difference between inn and inp. The control signal is provided to the pseudo-inverter 202 to adjust the duty cycle of the input clock signal.

If the duty cycle of the input clock signal is less than 50%, the magnitude of the control signal increases. As a result, the PMOS transistor $M_3$ of the pseudo inverter 202 becomes weak, which results in a longer time required to obtain the output clock signal at node N (that is, the clock signal has a longer rise time). Consequently, the time required to obtain the adjusted clock signal at node M increases. However, if the duty cycle of the input clock signal is more than 50%, the magnitude of control signal decreases. As a result, transistor $M_3$ becomes strong and the fall time of the output clock signal at the node N becomes large, which decreases the time required to obtain the adjusted clock signal at node M. When the DCC 200 achieves steady state, corresponding to a predetermined duty cycle of the input clock signal, the control voltage stabilizes to a value that alters the duty cycle of the clock signals obtained at the nodes X and Y to be approximately equal to 50%. Further, if the duty cycle of the input clock signal changes, the DCC 200 ensures that the duty cycle of output clock signals obtained at the nodes X and Y does not deviate from 50%. In the ensuing steady state, the control voltage settles to a value different from the previous value.

Various components of the duty cycle correction circuit 200, such as the pseudo-inverter 202, the buffer chain 204, complementary buffer chains 208a and 208b, the duty cycle-to-voltage converters 214a and 214b, the level shifters 216a and 216b, the differential amplifier 218, and the self-bias generator 220 operate at a digital supply voltage (DVDD). Further, the differential amplifier 218 is biased using a self-bias signal generated by the self-bias generator 220.

Figure 3:
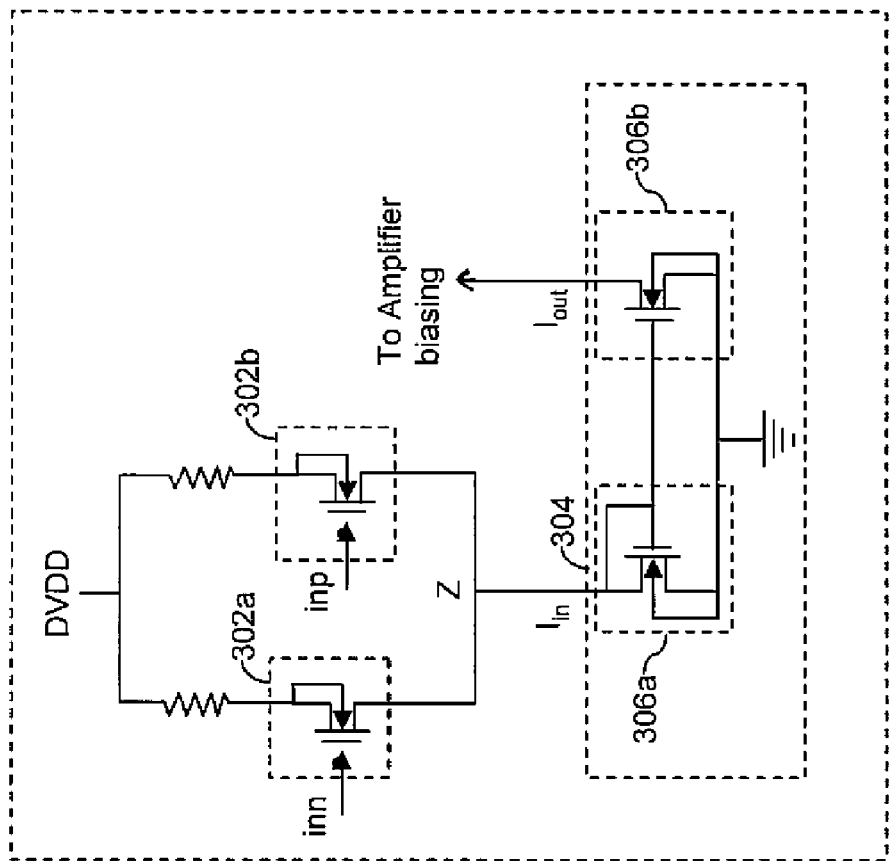
FIG. 3 is a schematic diagram illustrating a self-bias generator in accordance with an embodiment of the present invention.

Referring now to FIG. 3, a schematic diagram of the self-bias generator 220 in accordance with an embodiment of the present invention is shown. The self-bias generator 220 includes PMOS transistors 302a and 302b and a current mirror circuit 304. The current mirror circuit 304 includes NMOS transistors 306a and 306b.

Inn and inp are applied to the gates of the PMOS transistors 302a and 302b. Since inn and inp represent the duty cycles of the first and the second clock signals, either inn or inp has a magnitude close to $V_{dd}$ and the other has a magnitude close to GND. Therefore, at any instant in time, at least one of the PMOS transistors 302a and 302b is conducting and consequently node Z at the junction of the drains of the PMOS transistors 302a and 302b is high. As a result, a self-bias current continuously flows from the node Z to the current mirror circuit 304. In the steady-state, when the duty cycles of the first and the second clock signals are approximately equal to 50%, inn and inp are approximately equal and PMOS transistors 302a and 302b conduct equally. The current mirror circuit 304 replicates the input current, $I_{in}$, as output current, $I_{out}$, based on the aspect ratios of the NMOS transistors 306a and 306b. The aspect ratio of a PMOS or NMOS transistor is defined as the W/L ratio of the MOS transistor, in which W is the width and L is the length of a conducting channel of the MOS transistor. The relationship between the output current, the input current, and the aspect ratios of the NMOS transistors 306a and 306b may be expressed as follows:

$$I_{out}/I_{in}=(W/L)_{M4}/(W/L)_{M3}$$

Therefore, if the W/L ratios of $M_3$ and $M_4$ are identical, in accordance with the above relation $I_{out}=I_{in}$. In an embodiment of the present invention, the W/L ratios of the NMOS transistors 306a and 306b are selected such that $I_{out}$ is a multiple of $I_{in}$.

Referring now to FIG. 4, a schematic diagram illustrating a DCC 400 in accordance with another embodiment of the present invention is shown. The DCC 400 is similar to the DCC 200 shown in FIG. 1, except that instead of the level shifters 216a and 216b, the DCC 400 includes operational amplifiers 402a and 402b, and a resistor ladder 404.

The DCC 400 generates the first and second duty cycle signals as discussed above with reference to the DCC 200. The first and second duty cycle signals are provided at respective positive terminals of the operational amplifiers 402a and 402b. The operational amplifiers 402a and 402b have a negative feedback configuration, which ensures that the first and second duty cycle signals are replicated at outputs of the operational amplifiers 402a and 402b as a first output signal and a second output signal, respectively. The first output signal is provided to the negative input terminal (inn) of the differential amplifier 202 and to ground via a resistor $R_1$. The second output signal is provided to the resistor ladder 404. The resistor ladder 404 includes resistors $R_2$ and $R_3$. A third output signal is generated between the resistors $R_2$ and $R_3$ and has a magnitude of $R_2/(R_2+R_3)$ times the second output signal. The third output signal is provided to the positive input terminal (inp) of the differential amplifier 218. The first and the third output signals are also provided to the self-bias generator 220. The self-bias generator 220 generates and provides bias potential to the bias terminal of the differential amplifier 218 in the same manner as for the DCC 200 described in conjunction with FIG. 2.

The DCC 400 may be configured to adjust the duty cycle of the input clock signal to obtain the adjusted clock signal having a predetermined duty cycle. For example, to configure the DCC 400 to provide an adjusted clock signal having a predetermined duty cycle equal to 60%, the ratio of the values of the resistors $R_1:R_2:R_3$ is 2:1:2.

A capacitor C may be connected to the output of the differential amplifier 218. The capacitor C ensures that the DCC is stable for all process, voltage, and temperature (PVT) values. The capacitor C also ensures that the DCC remains stable for variations in the frequency of the input clock signal. In an embodiment of the present invention, the value of the capacitor C is between 20 picofarads (pF) and 40 pF.

The duty cycle correction circuit of the present invention generates the control signal for adjusting the duty cycle of the input clock signal by comparing the first duty cycle signal (corresponding to first clock signal) with the second duty cycle signal (corresponding to second clock signal). Therefore, a reference signal having a predetermined voltage is not required to generate the control signal. Further, the level shifters shift the first and the second duty cycle signals by predetermined values to obtain level shifted signals suitable for being input to the differential amplifier. This eliminates the need of a differential amplifier capable of handling input signals with common mode voltages approximately equal to $V_{dd}/2$. It should be realized by persons skilled in the art that designing such a differential amplifier is cumbersome due to headroom requirements. In an embodiment of present invention configured for 50% duty cycle, the resistor ladder is not required, which leads to a reduction in power consumption.

Additionally, the differential amplifier is biased using a self-bias generator that operates at a supply voltage that is the same as that required by the remaining circuitry of the duty cycle correction circuit and of the logic circuit to which the adjusted clock signal is provided, thus a separate power supply is not required and the duty cycle correction circuit may be placed close to the logic circuit to which it is providing the clock signal. Therefore the need for routing the clock signal through various buffer stages is eliminated. This leads to a reduction in design complexity. Further, since the differential amplifier is biased using the self-bias generator, which uses the first and the second level shifted signals for self-bias signal generation, the need for a current reference circuit for translating the differential amplifier to a suitable operating point is eliminated.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:
1. A duty cycle correction circuit for correcting the duty cycle of an input clock signal, comprising:
a pulse-width control block for generating an adjusted clock signal, wherein the pulse-width control block receives the input clock signal and a control signal, wherein pulse-width of the input clock signal is adjusted based on the control signal to generate the adjusted clock signal;
a first buffer chain for generating a first clock signal using the adjusted clock signal, wherein the first buffer chain comprises an even count of inverters and a pass transistor; and
a second buffer chain for generating a second clock signal using the adjusted clock signal, wherein the second buffer chain comprises an odd count of inverters;
a first duty cycle-to-voltage converter, connected to the first buffer chain, for generating a first duty cycle signal representing the duty cycle of the first clock signal;
a second duty cycle-to-voltage converter, connected to the second buffer chain, for generating a second duty cycle signal representing the duty cycle of the second clock signal;
a first level shifter, connected to the first duty cycle-to-voltage converter, for level shifting the first duty cycle signal by a predetermined value to generate a first level shifted signal;
a second level shifter, connected to the second duty cycle-to-voltage converter, for level shifting the second duty cycle signal by the predetermined value to generate a second level shifted signal;
a differential amplifier, connected to the first and second level shifters for receiving the first and second level shifted signals and generating the control signal; and
a self-bias generator, connected to the first and second level shifters for receiving the first and second level shifted signals, and generating a self-bias signal used to bias the differential amplifier.

2. The duty cycle correction circuit of claim 1, wherein the pulse width control block comprises a pseudo-inverter and an odd count of inverters sequentially connected, wherein the pseudo-inverter comprises a p-type metal oxide semiconductor (PMOS) transistor and an n-type metal oxide semiconductor (NMOS) transistor, wherein the PMOS transistor receives the control signal at a gate thereof and the NMOS transistor receives the input clock signal at a gate thereof, and wherein a drain of the PMOS transistor is connected to a drain of the NMOS transistor.

3. The duty cycle correction circuit of claim 1, wherein the input clock signal is generated by a phase locked loop clock generator.

4. The duty cycle correction circuit of claim 1, wherein the first level shifter comprises a first NMOS transistor and a first resistor connected to a source of the first NMOS transistor, the second level shifter comprises a second NMOS transistor and a second resistor connected to a source of the second NMOS transistor, wherein the first duty cycle signal is provided to a gate of the first NMOS transistor, and the second duty cycle signal is provided to a gate of the second NMOS transistor.

5. The duty cycle correction circuit of claim 4, wherein the first level shifted signal is obtained at the source of the first NMOS transistor, and the second level shifted signal is obtained at the source of the second NMOS transistor.

6. The duty cycle correction circuit of claim 1, wherein the first level shifter comprises a first PMOS transistor and a first resistor connected to a source of the first PMOS transistor, wherein the second level shifter comprises a second PMOS transistor and a second resistor connected to a source of the second PMOS transistor, and wherein the first duty cycle signal is provided to a gate of the first PMOS transistor, and the second duty cycle signal is provided to a gate of the second PMOS.

7. The duty cycle correction circuit of claim 6, wherein the first level shifted signal is obtained at the source of the first PMOS transistor, and the second level shifted signal is obtained at the source of the second PMOS transistor.

8. The duty cycle correction circuit of claim 1, wherein the self-bias generator comprises first and second PMOS transistors, wherein a drain of the first PMOS transistor is connected to a drain of the second PMOS transistor, a source of the first PMOS transistor is connected through a first resistor to a supply voltage, a source of the second PMOS transistor is connected through a second resistor to the supply voltage, a gate of the first PMOS transistor receives the first level shifted signal, and a gate of the second PMOS transistor receives the second level shifted signal.

9. The duty cycle correction circuit of claim 8, wherein the self-bias generator further comprises a current mirror circuit connected to drains of the first PMOS and second PMOS transistors and to a bias terminal of the differential amplifier.

10. The duty cycle correction circuit of claim 1, further comprising a capacitor connected at an output stage of the differential amplifier.

11. The duty cycle correction circuit of claim 1, wherein the first and second duty cycle to voltage converters comprise RC circuits.

\* \* \* \* \*